US011215717B2

(12) United States Patent
Maruno et al.

(10) Patent No.: US 11,215,717 B2
(45) Date of Patent: Jan. 4, 2022

(54) PHOTON COUNTING DEVICE AND PHOTON COUNTING METHOD

(71) Applicant: HAMAMATSU PHOTONICS K.K., Hamamatsu (JP)

(72) Inventors: Tadashi Maruno, Hamamatsu (JP); Eiji Toda, Hamamatsu (JP); Mao Nakajima, Hamamatsu (JP); Teruo Takahashi, Hamamatsu (JP); Takafumi Higuchi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/764,053

(22) PCT Filed: Jun. 18, 2018

(86) PCT No.: PCT/JP2018/023141
§ 371 (c)(1),
(2) Date: May 14, 2020

(87) PCT Pub. No.: WO2019/102636
PCT Pub. Date: May 31, 2019

(65) Prior Publication Data
US 2020/0371261 A1 Nov. 26, 2020

(30) Foreign Application Priority Data

Nov. 24, 2017 (JP) .............. JP2017-225861

(51) Int. Cl.
*G01T 1/24* (2006.01)
*H04N 5/374* (2011.01)
*H04N 5/376* (2011.01)
*H04N 5/363* (2011.01)
*H04N 5/3745* (2011.01)
(Continued)

(52) U.S. Cl.
CPC ............. *G01T 1/247* (2013.01); *H04N 5/363* (2013.01); *H04N 5/376* (2013.01); *H04N 5/378* (2013.01);
(Continued)

(58) Field of Classification Search
CPC ......... G01T 1/247; G01T 1/208; H04N 5/363; H04N 5/37455; H04N 5/37457;
(Continued)

(56) References Cited

U.S. PATENT DOCUMENTS

2008/0317200 A1 12/2008 Lecomte et al.
2011/0315854 A1 12/2011 Janesick
(Continued)

FOREIGN PATENT DOCUMENTS

CN 101485195 A 7/2009
CN 104838645 A 8/2015
(Continued)

OTHER PUBLICATIONS

Masoodian, Saleh et al., "A 1Mjot 1040fps 0.22e-rms Stacked BSI Quanta Image Sensor with Cluster-Parallel Readout," 2017 International Image Sensor Workshop?IISW), May 30-Jun. 2, 2017, p. 230-p. 233.
(Continued)

*Primary Examiner* — Kiho Kim
(74) *Attorney, Agent, or Firm* — Faegre Drinker Biddle & Reath LLP

(57) ABSTRACT

A photon counting device includes a plurality of pixels each including a photoelectric conversion element configured to convert input light to charge, and an amplifier configured to amplify the charge converted by the photoelectric conversion element and convert the charge to a voltage, an A/D converter configured to convert the voltage output from the amplifier of each of the plurality of pixels to a digital value
(Continued)

and output the digital value, a correction unit configured to correct the digital value output from the A/D converter so that an influence of a variation in a gain and an offset value among the plurality of pixels is curbed, a calculation unit configured to output a summed value obtained by summing the corrected digital values corresponding to at least two pixels, and a conversion unit configured to convert the summed value output from the calculation unit to a number of photons.

8 Claims, 13 Drawing Sheets

(51) Int. Cl.
*H04N 5/378* (2011.01)
*G01T 1/208* (2006.01)

(52) U.S. Cl.
CPC ....... *H04N 5/3742* (2013.01); *H04N 5/37455* (2013.01); *H04N 5/37457* (2013.01); *G01T 1/208* (2013.01)

(58) Field of Classification Search
CPC ...... H04N 5/378; H04N 5/3742; H04N 5/376; H04N 5/365; H01L 31/10
See application file for complete search history.

(56) References Cited

U.S. PATENT DOCUMENTS

| | | | |
|---|---|---|---|
| 2014/0368704 A1* | 12/2014 | Nishihara | H04N 5/361 348/297 |
| 2015/0116567 A1 | 4/2015 | Gossage | |
| 2016/0197116 A1 | 7/2016 | Ikeda et al. | |
| 2016/0234450 A1 | 8/2016 | Nishihara et al. | |
| 2017/0212253 A1* | 7/2017 | Fu | A61B 6/4241 |
| 2017/0261620 A1 | 9/2017 | Kato et al. | |

FOREIGN PATENT DOCUMENTS

| | | |
|---|---|---|
| EP | 2330625 A2 | 6/2011 |
| JP | 2004-144734 A | 5/2004 |
| JP | 2011-071958 A | 4/2011 |
| JP | 2017-167125 A | 9/2017 |
| WO | WO-03/001243 A2 | 1/2003 |
| WO | WO-2016/006153 A1 | 1/2016 |
| WO | WO 2016/076767 A1 | 5/2016 |

OTHER PUBLICATIONS

English-language translation of International Preliminary Report on Patentability (IPRP) dated Jun. 4, 2020 that issued in WO Patent Application No. PCT/JP2018/023141.
International Preliminary Report on Patentability dated Jun. 4, 2020 for PCT/JP2018/023144.
Jiaju Ma et al., "Photon-number-resolving megapixel image sensor at room temperature without avalanche gain", Optica, vol. 4, No. 12, Dec. 2017, p. 1474-p. 1481.
Dakota A. Starkey et al., "Determining Conversion Gain and Read Noise Using a Photon-Counting Histogram Method for Deep Sub-Electron Read Noise Image Sensors", Journal of the Electron Devices Society, vol. 4, No. 3, May 2016, p. 129-p. 135.

* cited by examiner

Fig.4
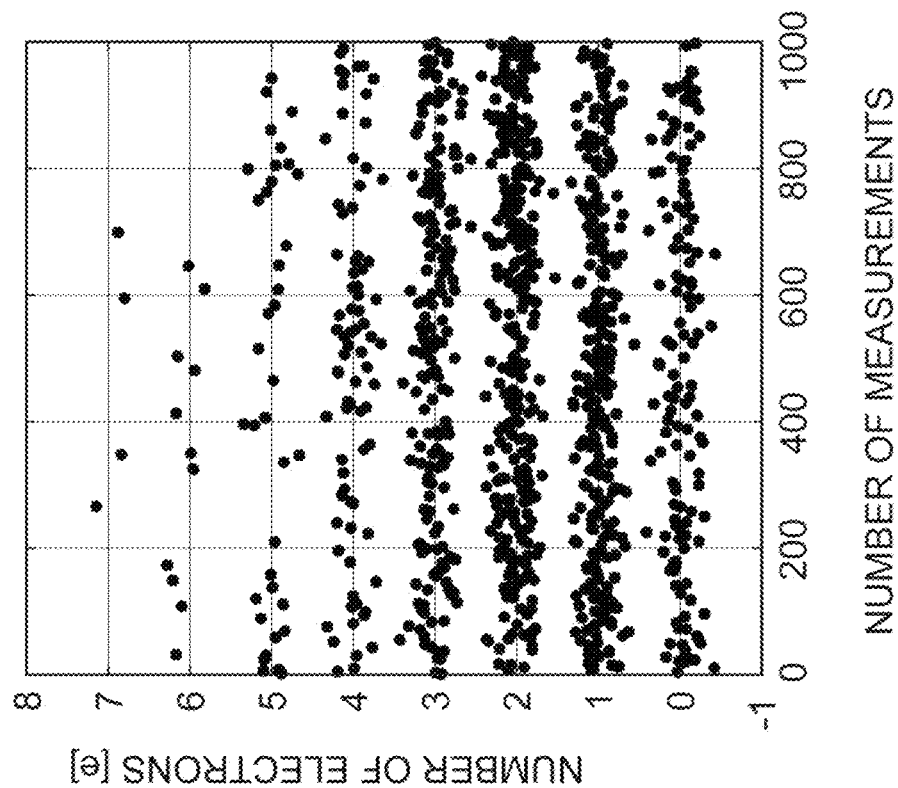
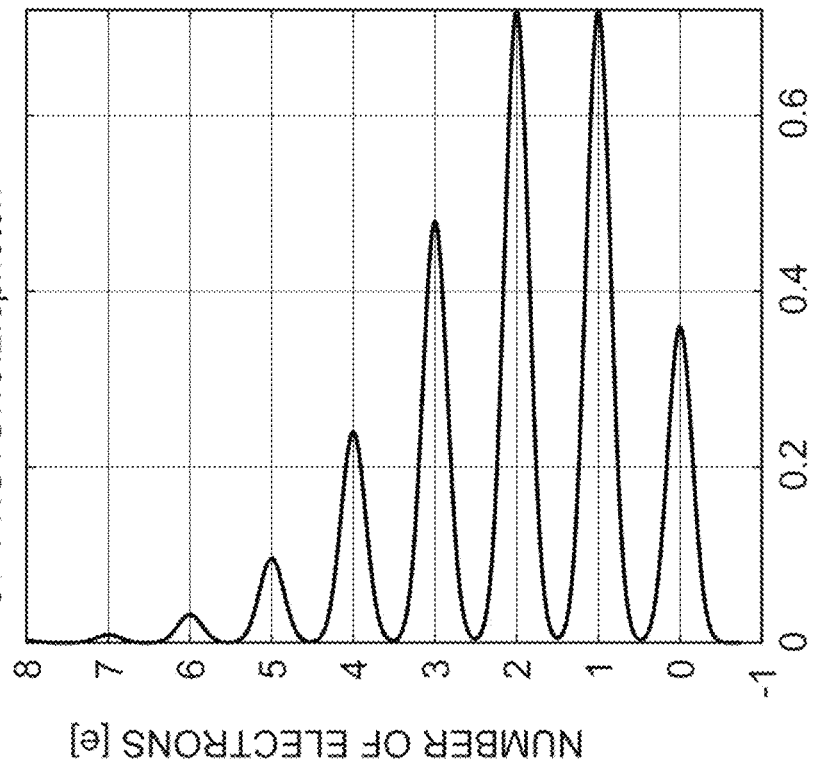

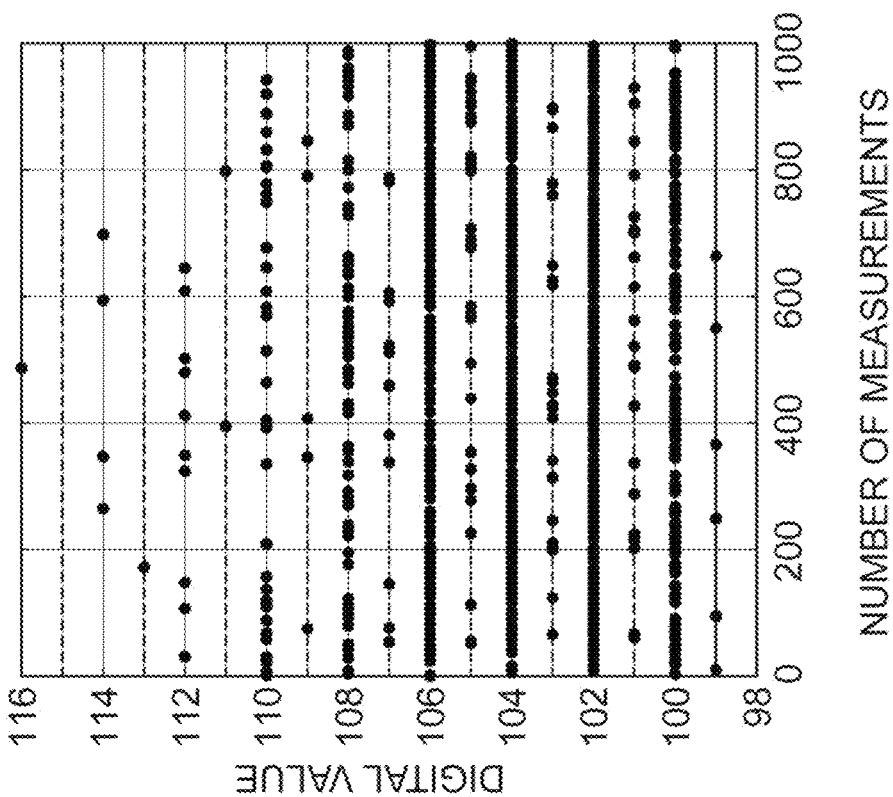
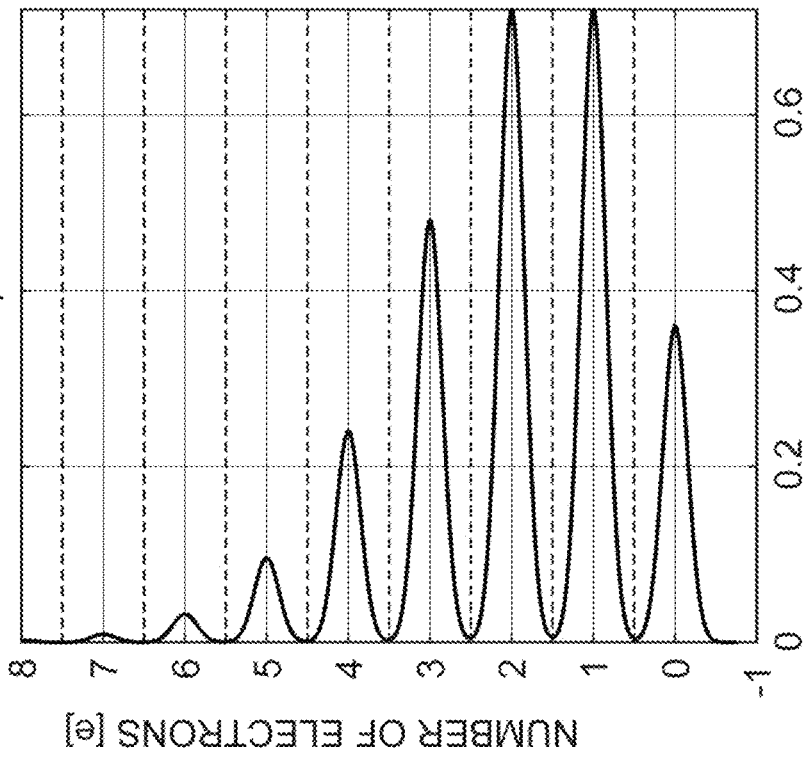
Fig. 5

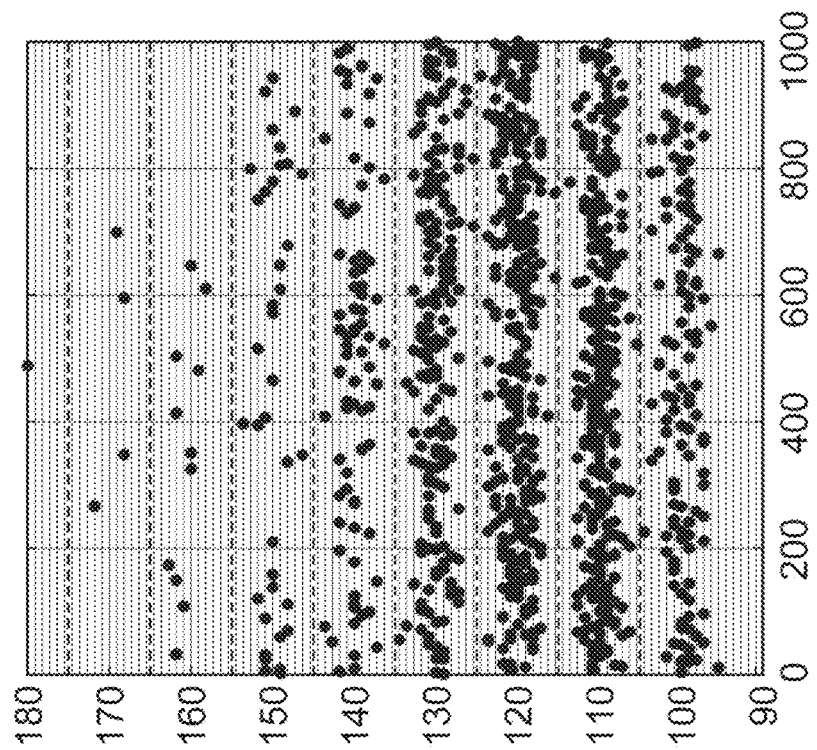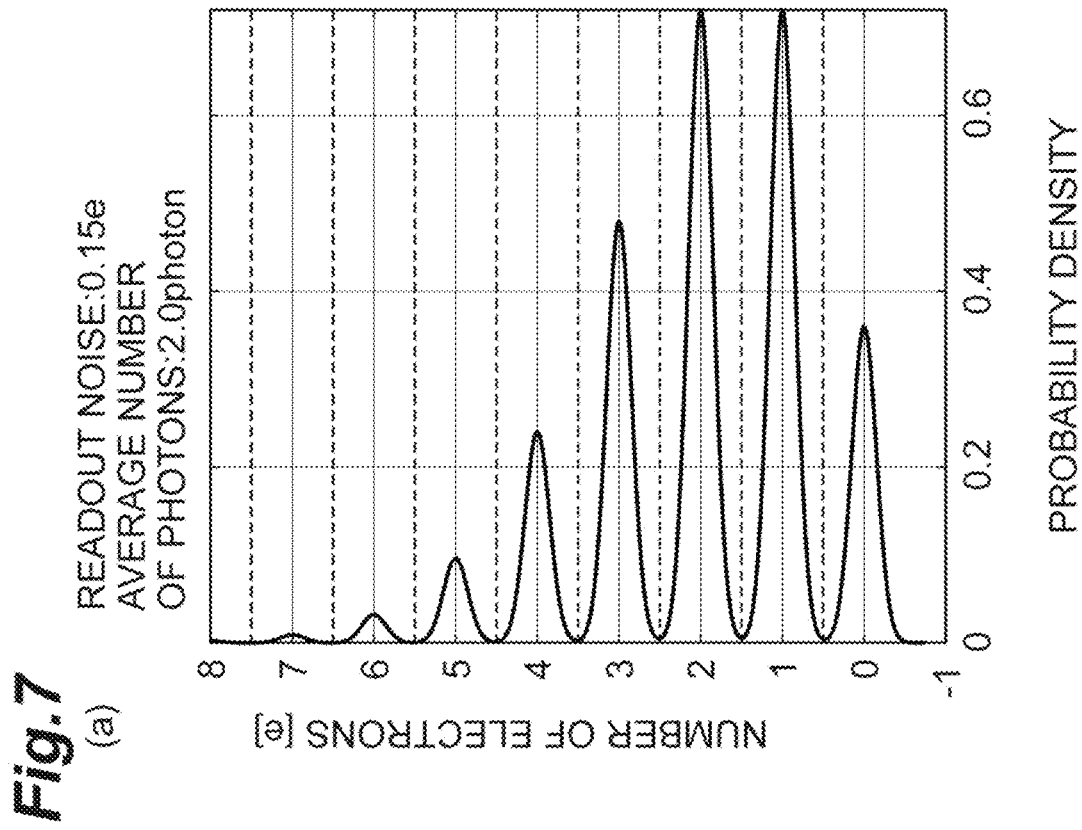
Fig.7

PHOTON COUNTING DEVICE AND PHOTON COUNTING METHOD

TECHNICAL FIELD

The present disclosure relates to a photon counting device and a photon counting method.

BACKGROUND ART

For example, Non-Patent Literature 1 describes a photon counting technique using a CMOS image sensor. In this technique, imaging is performed under a condition that only one photon is incident on one pixel in one frame by increasing a frame rate of the image sensor.

CITATION LIST

Patent Literature

[Non-Patent Literature 1] B Saleh Masoodian, Jiaju Ma, Dakota Starkey, Yuichiro Yamashita, and Eric R. Fossum, "A 1Mjot 1040 fps 0.22e-rms Stacked BSI Quanta Image Sensor with Cluster-Parallel Readout", Proceedings of 2017 International Image Sensor Workshop (IISW), May 30-Jun. 2, 2017, P230-233

SUMMARY OF INVENTION

Technical Problem

For example, when photon counting is performed using a CMOS image sensor, it is conceivable to discriminate the number of photons on the basis of a digital value output from an A/D converter. However, in the CMOS image sensor, each of pixels constituting the sensor has readout noise. Further, a gain and an offset value of a plurality of the pixels have a variation in a certain range. In this case, since digital values when the same number of photons are incident are different among the pixels, there is concern that photon counting accuracy is degraded when binning of the pixels is performed.

An object of an aspect of the present disclosure is to provide a photon counting device and a photon counting method capable of curbing degradation of photon counting accuracy.

Solution to Problem

A photon counting device according to an aspect includes a plurality of pixels each including a photoelectric conversion element configured to convert input light to charge, and an amplifier configured to amplify the charge converted by the photoelectric conversion element and convert the charge to a voltage; an A/D converter configured to convert the voltage output from the amplifier of each of the plurality of pixels to a digital value and output the digital value; a correction unit configured to correct the digital value output from the A/D converter so that an influence of a variation in a gain and an offset value among the plurality of pixels is curbed; a calculation unit configured to output a summed value obtained by summing the corrected digital values in at least two pixels; and a conversion unit configured to convert the summed value output from the calculation unit to a number of photons.

In such a photon counting device, the voltage according to the photon input to the photoelectric conversion element is output from the amplifier. The voltage is converted to the digital value by the A/D converter. When pixel binning is performed, the summed value obtained by summing the digital values corrected by the correction unit is converted to the number of photons. The correction unit corrects the digital value so that an influence of the variation in the gain and the offset value among the plurality of pixels is curbed. That is, when the same number of photons have been input, a variation in each pixel is curbed in the corrected digital value. Thereby, it is difficult for the influence of the variation in the gain and offset value among the pixels to be reflected in the summed value, and it is easy for only the number of photons to be reflected in the summed value. Therefore, a degradation of photon counting accuracy can be curbed.

Further, the correction unit may have a parameter corresponding to the gain and the offset value, which is a preset parameter common to a plurality of pixels, and correct the digital value for each of the plurality of pixels on the basis of a deviation between the gain and offset value and the parameter. In this configuration, since the digital value is corrected according to a deviation between the parameter serving as a reference, and the gain and offset value, for example, the summed value can be converted to the number of photons using a threshold value based on the parameter.

Further, the readout noise of the amplifier may be equal to or less than 0.2 [e-rms]. In this case, for example, an incorrect detection rate can be curbed to 1% or less. Further, the readout noise of the amplifier may be equal to or less than 0.15 [e-rms]. In this case, for example, the incorrect detection rate can be curbed to 0.1% or less.

Further, the gain may be equal to or more than 10 [DN/e]. By increasing the gain, it is possible to accurately reproduce an analog value that is output from the amplifier.

Further, a photon counting method of an aspect includes converting light input to respective photoelectric conversion elements constituting a plurality of pixels to charge; amplifying, by an amplifier constituting the plurality of pixels, the converted charge and converting the charge to a voltage; converting, by an A/D converter, the voltages output from the respective amplifiers to digital values and outputting the digital values; correcting the digital value output from the A/D converter so that an influence of a variation in a gain and an offset value among the plurality of pixels is curbed; summing the corrected digital values corresponding to at least two pixels and outputting a summed value; and converting the summed value to the number of photons.

In such a photon counting method, the voltage output from the amplifier according to input photons is converted to the digital value. When pixel binning is performed, the summed value obtained by summing the digital values is converted to the number of photons. The digital value is corrected so that the influence of the variation in the gain and the offset value among the plurality of pixels is curbed. That is, when the same number of photons have been input, a variation in each pixel is curbed in the corrected digital value. Therefore, the influence of the variation in the gain and the offset value among pixels is also curbed in the summed value. Therefore, a degradation of photon counting accuracy can be curbed.

Further, the correcting of the digital value may include correcting the digital value for each of the plurality of pixels on the basis of a deviation between the gain and offset value and a parameter, and the parameter may correspond to the gain and the offset value and may be set in advance to be common to the plurality of pixels. In this configuration, since the digital value is corrected according to a deviation between the parameter serving as a reference, and the gain and offset value, for example, the summed value can be converted to the number of photons using a threshold value based on the parameter.

Advantageous Effects of Invention

With the photon counting device and the photon counting method according to an aspect, it is possible to curb a degradation of photon counting accuracy.

BRIEF DESCRIPTION OF DRAWINGS

FIG. 4(a) is a graph showing a relationship between the number of electrons and a probability density.

FIG. 4(b) is a graph showing a result of a simulation based on FIG. 4(a).

FIG. 5(a) is a graph showing a relationship between the number of electrons and a probability density.

FIG. 5(b) is a graph in which a result of a simulation based on FIG. 5(a) has been converted to a digital value.

FIG. 7(a) is a graph showing a relationship between the number of electrons and a probability density.

FIG. 7(b) is a graph in which a result of a simulation based on FIG. 7(a) has been converted to a digital value.

DESCRIPTION OF EMBODIMENTS

Figure 1:
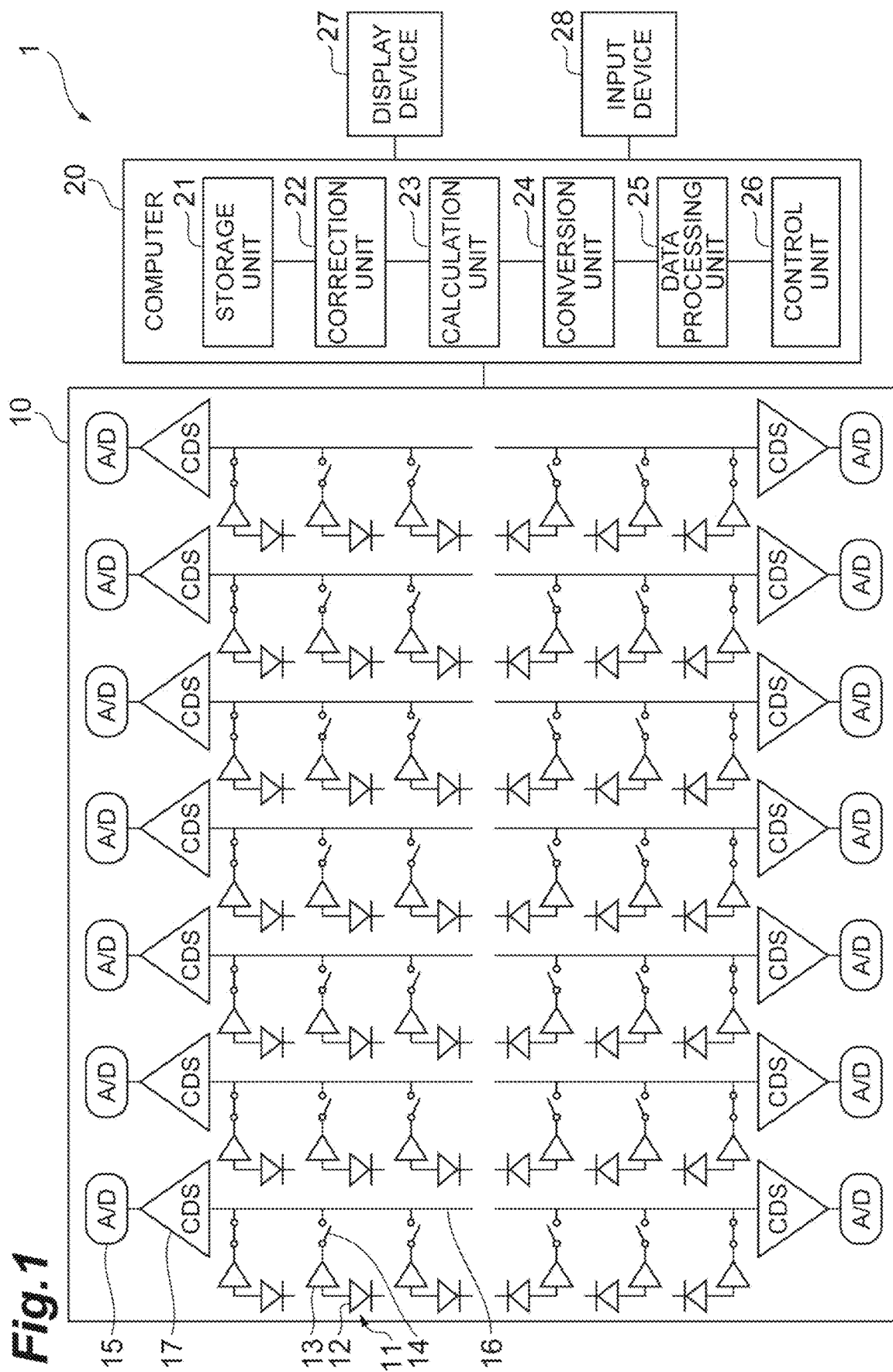
FIG. 1 is a diagram illustrating a configuration of a photon counting device according to an embodiment.

Hereinafter, embodiments will be specifically described with reference to the drawings. For convenience, substantially the same elements are denoted by the same reference numerals, and a description thereof may be omitted. Further, photon counting in the embodiment includes both counting of the number of photoelectrons generated in each pixel of an image sensor and counting of the number of photons in consideration of quantum efficiency (QE) of an image sensor.

First Embodiment

FIG. 1 is a diagram illustrating a configuration of a photon counting device. As illustrated in FIG. 1, the photon counting device 1 includes a CMOS image sensor 10, and a computer 20 connected to the CMOS image sensor 10. The CMOS image sensor 10 includes a plurality of pixels 11 and A/D converters 15. The plurality of pixels 11 are disposed two-dimensionally and arranged in a row direction and a column direction. Each pixel 11 has a photodiode (a photoelectric conversion element) 12 and an amplifier 13. The photodiode 12 accumulates electrons (photoelectrons) generated due to input of photons as charge. The amplifier 13 converts the charge accumulated in the photodiode 12 to a voltage and amplifies the voltage. The amplified voltage is transferred to a vertical signal line 16 for each line (for each row) by switching of a selection switch 14 of each pixel 11. A correlated double sampling (CDS) circuit 17 is disposed in each vertical signal line 16. The CDS circuit 17 removes noise that varies between pixels, and temporarily stores the transferred voltage.

The A/D converter 15 converts the voltage output from each of the amplifiers 13 in the plurality of pixels 11 to a digital value. In the first embodiment, the A/D converter 15 converts the voltage stored in the CDS circuit 17 to a digital value. The respective digital values after the conversion are output to the computer 20. For example, the digital value may be sent to a horizontal signal line (not illustrated) by switching for column selection and output to the computer 20. Thus, in the CMOS image sensor 10, when photons are input to each pixel 11, a digital value according to the number of input photons is output to the computer 20. The A/D converter 15 may be provided in each pixel 11.

Figure 2:
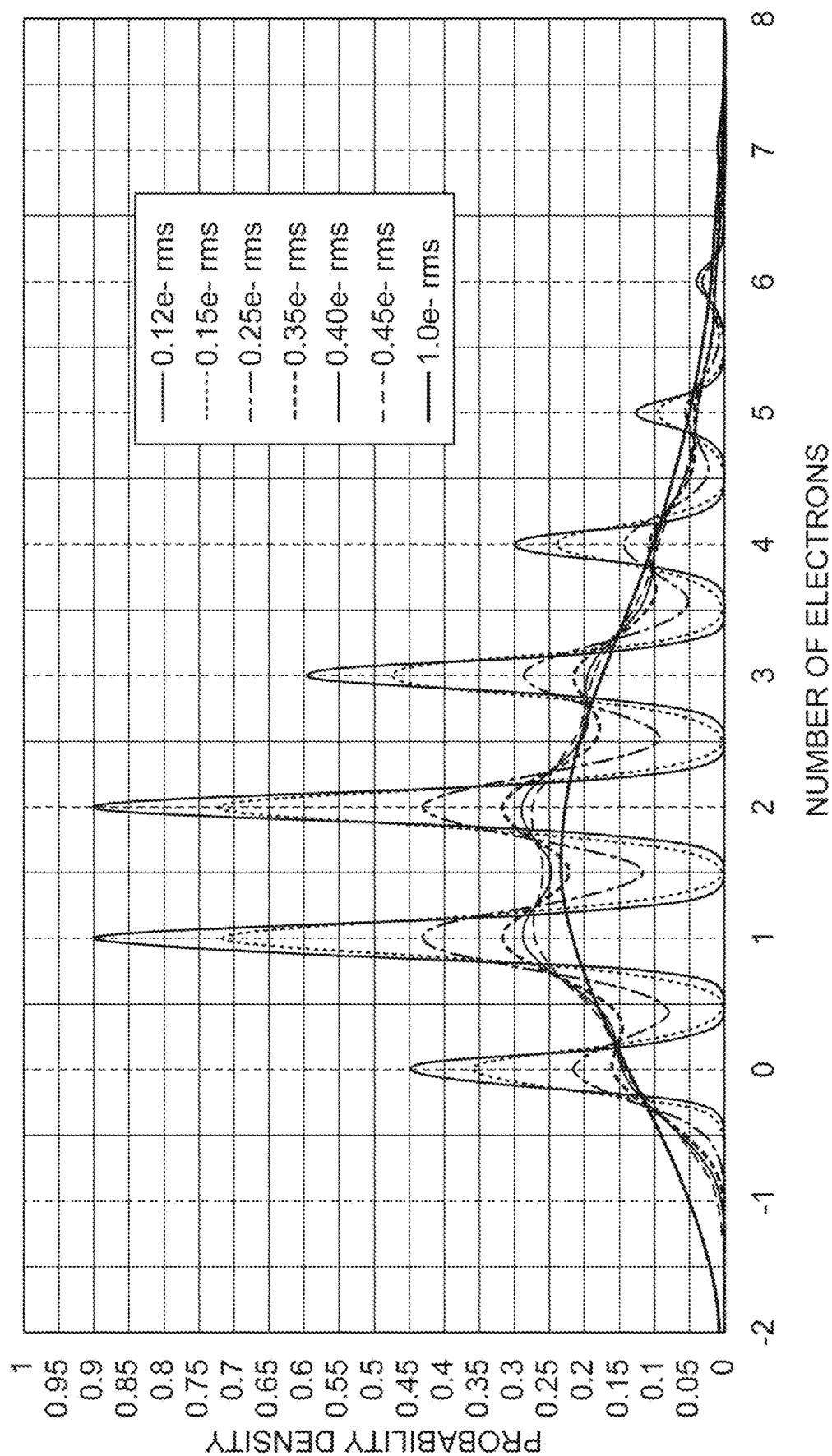
FIG. 2 is a graph showing a relationship between the number of electrons and a probability density.

When the voltage amplified by the amplifier 13 is read, readout noise, which is random noise, is generated in the amplifier 13. FIG. 2 is a graph showing a probability distribution of electrons, in which a horizontal axis represents the number of electrons and a vertical axis represents a probability density. The number of electrons generated by the input photons follows a Poisson distribution, as illustrated in FIG. 2. In FIG. 2, the probability distribution of electrons when two photons are input to one pixel on average is shown for each readout noise. Examples of the readout noise include 0.12, 0.15, 0.25, 0.35, 0.40, 0.45, and 1.0 [e-rms]. When the readout noise is smaller, a peak of a waveform of the probability distribution appears to be sharper and separation of distributions for respective numbers of electrons becomes clear, as illustrated in FIG. 2. On the other hand, when the readout noise increases, distributions overlap with each other in the adjacent numbers of electrons, and it becomes difficult to separate the distributions of the respective numbers of electrons. For example, when the readout noise is equal to or less than 0.40 [e-rms], a peak for each number of electrons appears identifiably. On the other hand, when the readout noise is equal to or more than 0.45 [e-rms], it is difficult to identify the peak for each number of electrons. In the first embodiment, a magnitude of the readout noise allowing distinguishment between the numbers of electrons to be distinguished has been obtained according to whether or not the peak can be identified. Thereby, in the CMOS image sensor 10 of the first embodiment, the readout noise is equal to or less than 0.4 [e-rms]. An inflection point may be detected by secondarily differentiating the probability distribution and the magnitude of the readout noise allowing distinguishment between the numbers of electrons may be obtained.

Figure 3:
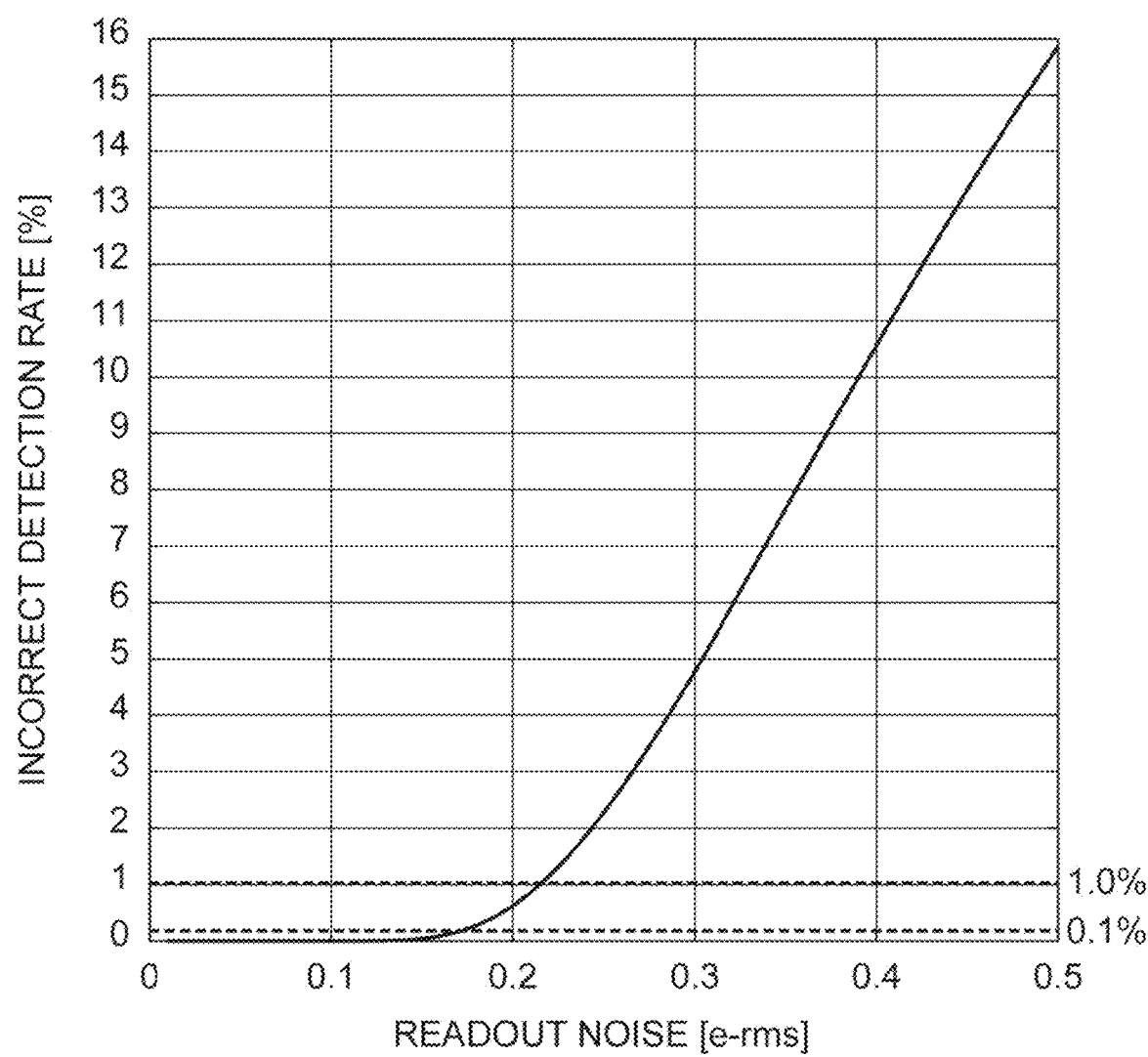
FIG. 3 is a graph showing a relationship between readout noise and an incorrect detection rate.

When a threshold value for distinguishing between the adjacent numbers of electrons has been set, an incorrect detection rate of the number of detected electrons changes according to readout noise. FIG. 3 is a graph showing a relationship between the readout noise and the incorrect detection rate when a threshold value is an intermediate value between the numbers of electrons, such as 0.5e, 1.5e, 2.5e, . . . . The incorrect detection rate is a rate at which an incorrect number of electrons is detected, and is caused by the spread of the probability distribution of the electrons. As illustrated in FIG. 3, when the incorrect detection rate is desired to be equal to or less than 1%, the readout noise needs to be equal to or less than 0.2 [e-rms]. Further, when the incorrect detection rate is desired to equal to or less than 0.1%, the readout noise needs to be equal to or less than 0.15 [e-rms].

FIG. 4(a) is a graph showing a relationship between the number of electrons and the probability density. FIG. 4(b) is a graph showing a result of a simulation based on FIG. 4(a). In FIG. 4(a), a probability distribution of electrons when two photons are input to one pixel on average in a case in which readout noise is 0.15 [e-rms] is shown. In FIG. 4(b), a distribution of the number of electrons for each number of measurements is shown by an analog value. The A/D converter 15 converts the analog value illustrated in FIG. 4(b) to a digital value and outputs the digital value. The digital value output from each pixel 11 is shown by the following equation.

Digital value[DN]=gain[DN/e]×number of electrons [e]+offset value[DN]

Figure 6:
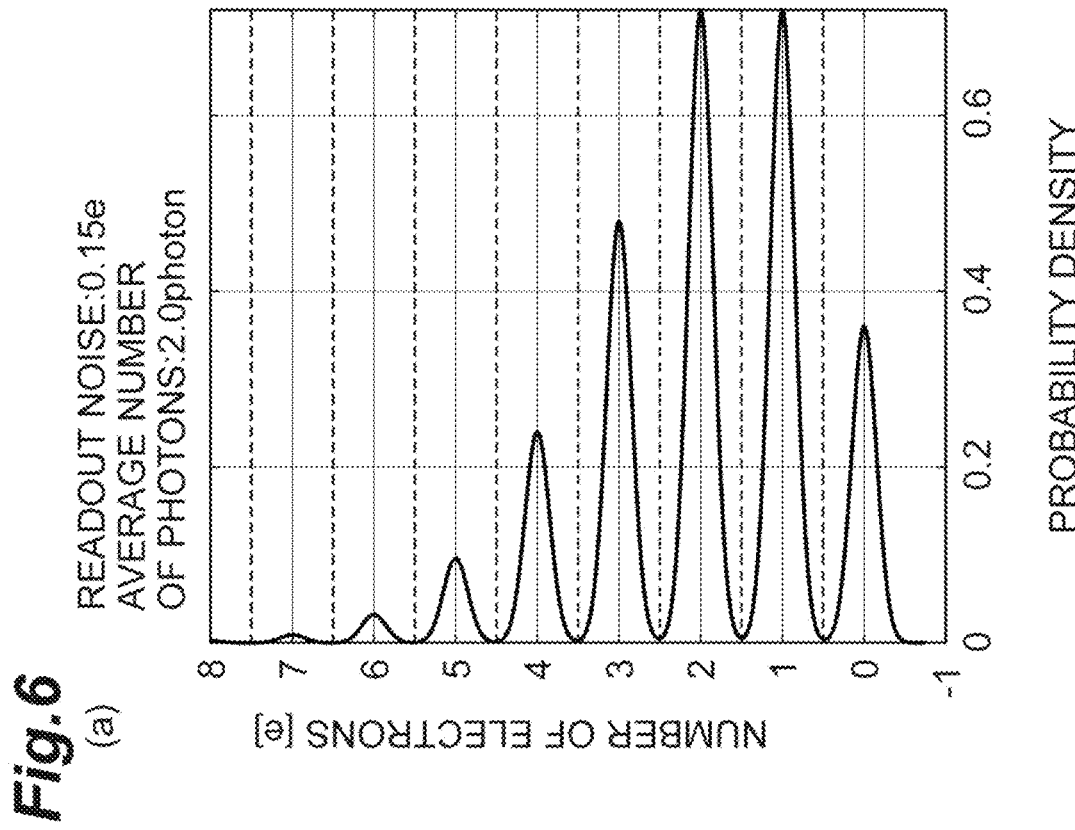
FIG. 6(a) is a graph showing a relationship between the number of electrons and a probability density.
FIG. 6(b) is a graph in which a result of a simulation based on FIG. 6(a) has been converted to a digital value.

FIGS. 5(b), 6(b), and 7(b) show graphs when the analog value of FIG. 4(b) has been converted to a digital value. In FIGS. 5(a), 6(a), and 7(a), a probability distribution of electrons when two photons are input to one pixel on average in a case in which readout noise is 0.15 [e-rms] is shown, as in FIG. 4(a). In FIGS. 5 to 7, threshold values for distinguishing the numbers of electrons are set with reference to intermediate values between the numbers of electrons, such as 0.5e, 1.5e, 2.5e . . . . In FIGS. 5 to 7, the threshold values are indicated by broken lines. In FIG. 5(b), the gain is 2 [DN/e] and the offset value is 100 [DN]. As illustrated in FIG. 5(b), when the gain is 2 [DN/e], it is difficult for a variation in a measured value observed in an analog value to be reflected on the graph. Further, a proportion of output of digital values showing the same value as the threshold value is high.

In FIG. 6(b), the gain is 10 [DN/e] and the offset value is 100 [DN]. As illustrated in FIG. 6B, when the gain is 10 [DN/e], a distribution of digital values approximates to a distribution of analog values. On the other hand, since the gain is an even number, a digital value corresponding to the threshold value may be taken as illustrated in FIG. 6(b). In FIG. 7(b), the gain is 11 [DN/e] and the offset value is 100 [DN]. As illustrated in FIG. 7(b), when the gain is 11 [DN/e], the distribution of the digital values approximates to the analog values. Further, since the gain is an odd number, taking a digital value corresponding to the threshold value is curbed. Thus, by increasing a value of the gain, the output digital value can further approximate to the analog value. In the first embodiment, the CMOS image sensor 10 may have, for example, a gain equal to or more than 10 [DN/e].

Refer back to FIG. 1. The computer 20 physically includes, for example, a storage device such as a RAM and a ROM, a processor (an arithmetic circuit) such as a CPU, and a communication interface. Examples of such a computer 20 include a personal computer, a cloud server, a smart device (a smartphone, a tablet terminal, or the like), a microcomputer, and a field-programmable gate array (FPGA). The computer 20 functions as a storage unit 21, a correction unit 22, a calculation unit 23, a conversion unit 24, a data processing unit 25, and a control unit 26, for example, by a CPU of a computer system executing a program stored in a storage device. The computer 20 may be disposed inside a camera including the CMOS image sensor 10, or may be disposed outside the camera. A display device 27 and an input device 28 can be connected to the computer 20. The display device 27 is a display that can display, for example, a photon counting result obtained by the computer 20. The input device 28 is a keyboard, a mouse, and the like allowing a user to input measurement conditions. A common touch screen may be used as the display device 27 and the input device 28.

The storage unit 21 stores reference data for converting the digital value output from the CMOS image sensor 10 to the number of photons. The reference data includes, for example, a gain and an offset value for each of the plurality of pixels 11. Further, the reference data includes threshold value data for converting the digital value to a number of photons. The threshold value data may be prepared for a binning size. The binning size may be, for example, the number of pixels to be binned. In the case of 3×3 pixel binning, the binning size is "9".

The correction unit 22 corrects the digital value corresponding to each pixel output from the A/D converter 15. In the embodiment, the digital value is corrected so that an influence of the variation in the gain and offset value among the plurality of pixels 11 is curbed.

The calculation unit 23 outputs a summed value obtained by summing the digital values after the correction of at least two pixels 11. In the plurality of pixels of which the digital values are summed, the numbers of pixels in a row direction may be the same as the number of pixels in a column direction, like 2×2 pixels, 3×3 pixels, or the like. Further, in the plurality of pixels of which the digital values are summed, the numbers of pixels in the row direction may be different from the number of pixels in the column direction, like 1×2 pixels, 2×5 pixels, or the like. Further, the digital values after correction of all the pixels constituting the CMOS image sensor 10 may be summed.

The conversion unit 24 converts the summed value output from the calculation unit 23 to the number of photons by referring to the threshold value data stored in the storage unit 21. The data processing unit 25 creates a two-dimensional image indicating the number of photons in each pixel 11 on the basis of the number of photons output from the conversion unit 24. Further, the data processing unit 25 may create, for example, a histogram, which is a plot of the number of pixels with respect to the number of photons. The created two-dimensional image or the like can be output to the display device 27. The control unit 26 can generally control each function of the computer 20 or the CMOS image sensor 10. For example, the control unit 26 controls the photon counting device 1 on the basis of setting conditions input by the input device 28.

Next, details of the photon counting device 1 will be described while showing specific examples focusing on processes of the correction unit 22, the calculation unit 23, and the conversion unit 24. Hereinafter, an example in which the CMOS image sensor 10 of the photon counting device 1 includes a plurality of (nine) pixels 11 arranged in 3 rows×3 columns, and binning of 3×3 pixels is performed for simplicity of description will be described. The number of pixels in the row direction and the column direction in binning can be designated by measurement conditions input to the input device 28.

Figure 8:
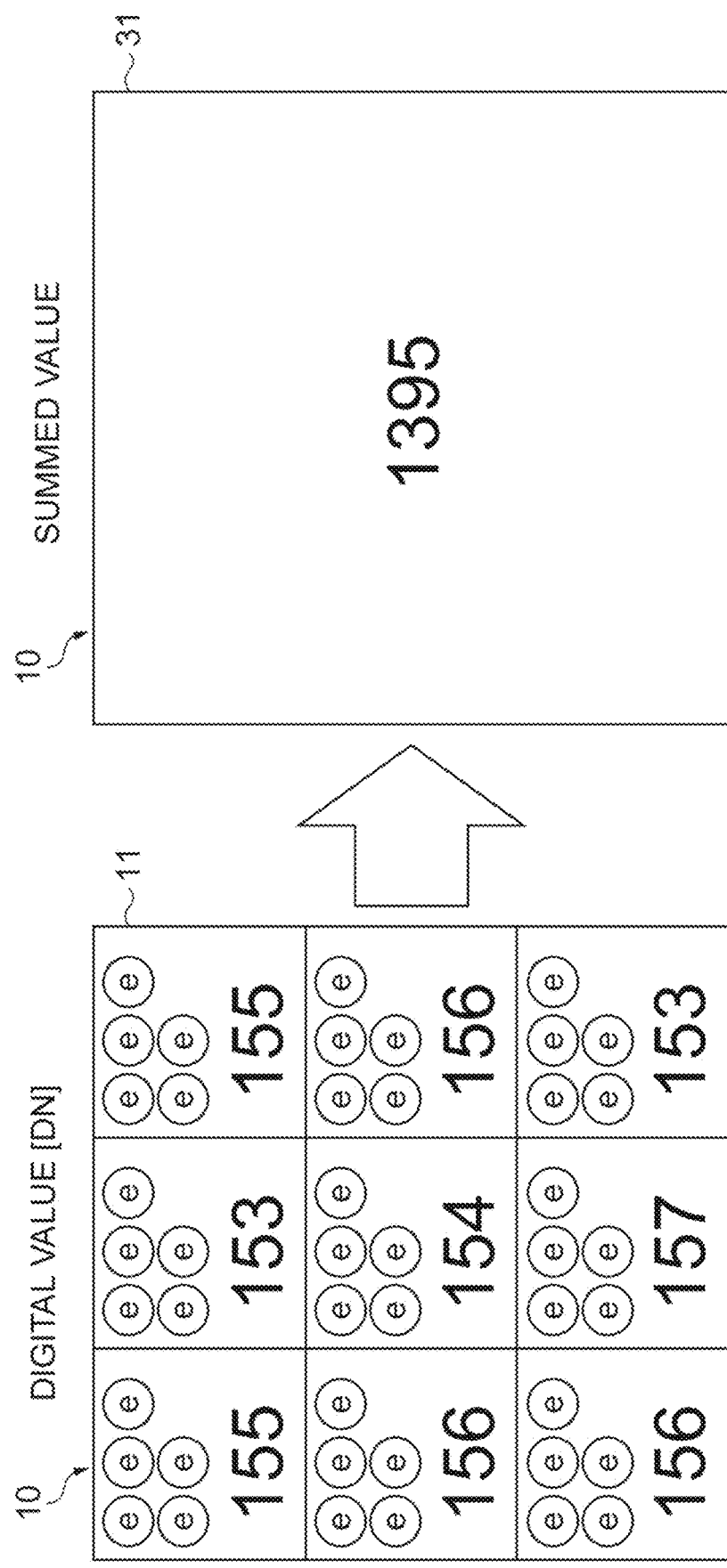
FIG. 8 is a diagram schematically illustrating a process of converting a measured digital value to a number of photons.

First, a method of converting a digital value to a number of photons when it is assumed that there is no variation in the gain and the offset value will be described. FIG. 8 schematically illustrates a process of converting the measured digital value to the number of electrons. In the example of FIG. 8, it is assumed that the offset value is 100 [DN] and the gain is 11 [DN/e] in each pixel. Further, the readout noise is assumed to be 0.15 [e-rms].

As illustrated in FIG. 8, in such a CMOS image sensor 10, when photons are input to each pixel 11, charge is accumulated in each pixel 11 according to the number of photons. In the illustrated example, five electrons are accumulated in all the pixels 11. That is, 45 electrons are accumulated in the nine pixels. The accumulated charge is converted to a voltage by the amplifier 13 and is converted to a digital value by the A/D converter 15. In FIG. 8, the digital value in each pixel is shown inside the pixel.

The digital values in the respective pixels are summed in pixels that are binning targets. In the example of FIG. 8, digital values (155, 153, 155, 156, 154, 156, 156, 157, and 153) of nine pixels arranged in 3 rows×3 columns are summed. Thereby, as illustrated in FIG. 8, a summed value of the digital values in the binned pixel 31 becomes 1395.

The summed value is converted to the number of electrons. In this case, the summed value is converted to the number of electrons using, for example, a threshold value range. When an upper limit and a lower limit of the threshold value range are intermediate values of the number of electrons, a threshold value indicating the lower limit of each number of electrons and a threshold value indicating the upper limit thereof are expressed by the following equations, respectively, and a range from the threshold value of the lower limit to the threshold value of the upper limit is a threshold value range corresponding to the number of electrons.

Threshold value(lower limit)=(number of electrons−0.5)×gain+offset value×binning size Threshold value(upper limit)=(number of electrons+0.5)×gain+offset value×binning size In the example of FIG. 8, it is assumed that the gain and the offset value are 11 [DN/e] and 100 [DN], respectively, and there is no variation in the gain and the offset value between pixels, as described above. Therefore, for example, the lower limit of the threshold value range corresponding to 45 electrons is 1390 [DN], and the upper limit thereof is 1400 [DN]. When the digital value illustrated in FIG. 8 has been converted to the number of electrons by referring to this threshold value range, 1395 [DN], which is the summed value of the binned pixel 31, is converted to 45 electrons. Since the number of electrons generated by the input photons follows a Poisson distribution, it is possible to obtain the number of photons by dividing the converted number of electrons by a quantum efficiency. For example, when the quantum efficiency is 100%, the number of electrons and the number of photons are the same.

Figure 9:
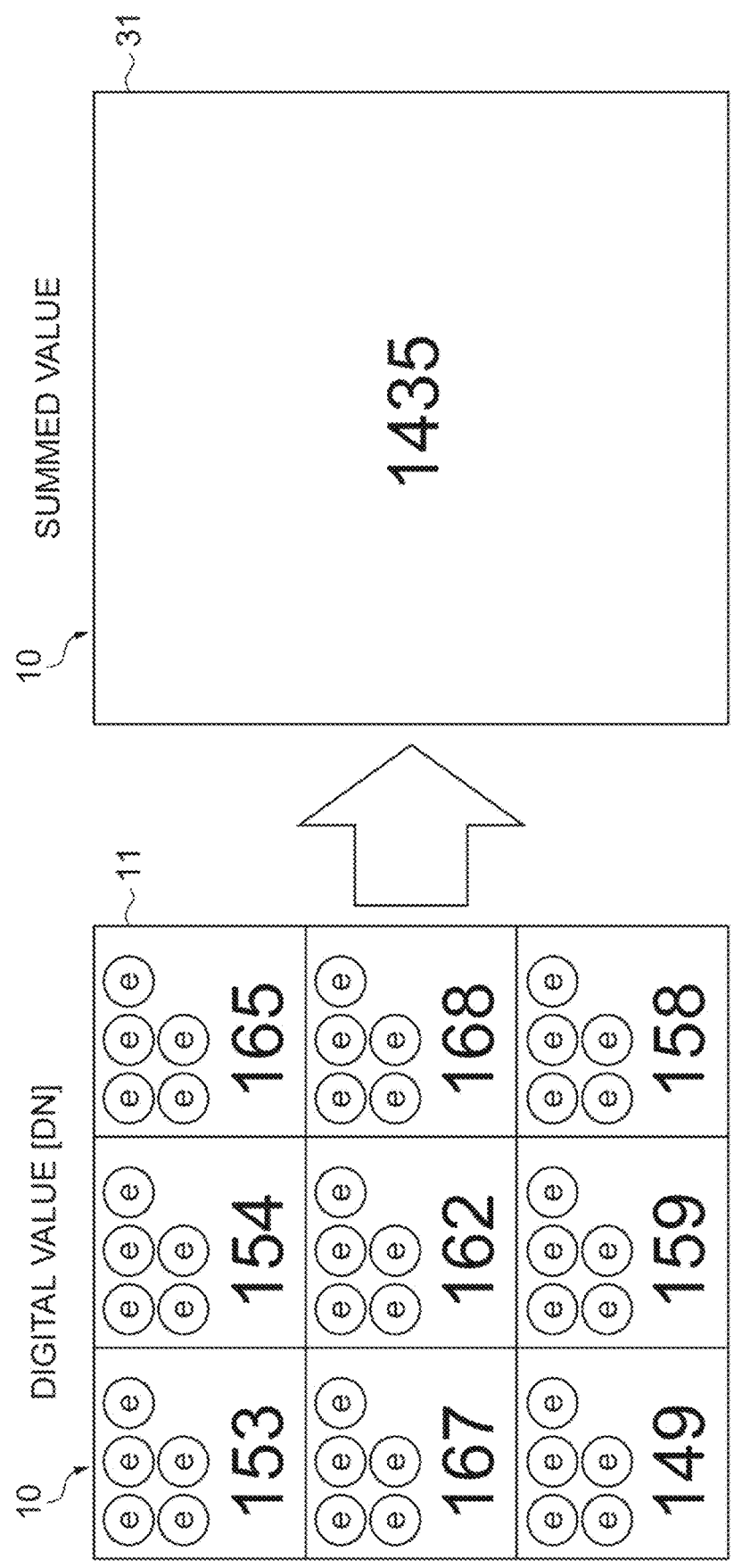
FIG. 9 is a diagram schematically illustrating a process of converting a measured digital value to a number of photons.

Next, a case in which a digital value is converted to the number of electrons using the same threshold value range as in FIG. 8 in a state in which the gain and the offset value have a variation will be considered. FIG. 9 illustrates an example of digital values when the gain and the offset value have a variation. In this example, an average gain is 11 [DN/e], and a variation σ in the gain is 10%. That is, a gain ±σ can have a value of 9.9 to 12.1. Further, an average offset value is 100 [DN], and a variation σ in the offset value is 3%. That is, an offset value ±σ can have a value from 97 to 103. In the example in FIG. 9, a model in which five electrons are accumulated in all the pixels, as in FIG. 8, is shown. When digital values of nine pixels arranged in 3 rows×3 columns are summed as in the example of FIG. 8, the summed value of the binned pixels 31 becomes 1435 [DN]. When the threshold value range is obtained on the basis of the average offset value and the average gain as in the example of FIG. 8, the threshold value range including 1435 [DN], which is the summed value, corresponds to 49 electrons. That is, 1435 [DN] is converted to 49 electrons. Thus, it may be difficult to convert the digital value to a correct number of electrons in a state in which the gain and the offset value have a variation.

Therefore, in the photon counting device 1 of the embodiment, the correction unit 22 corrects the digital value output from the A/D converter 15 so that an influence of a variation in the gain and the offset value among the plurality of pixels 11 is curbed. In the embodiment, since the correction unit 22 corrects the digital value of each pixel 11, an apparent gain and an apparent offset value are the same in each pixel 11. The digital value after the correction can be derived on the basis of a deviation between the gain and offset value of each pixel 11 and the apparent gain and offset value common to all the pixels. For example, the digital value after the correction is derived using the following correction equation. The apparent gain and the apparent offset value (parameter) are set in advance and stored in the storage unit 21.

Figure 10:
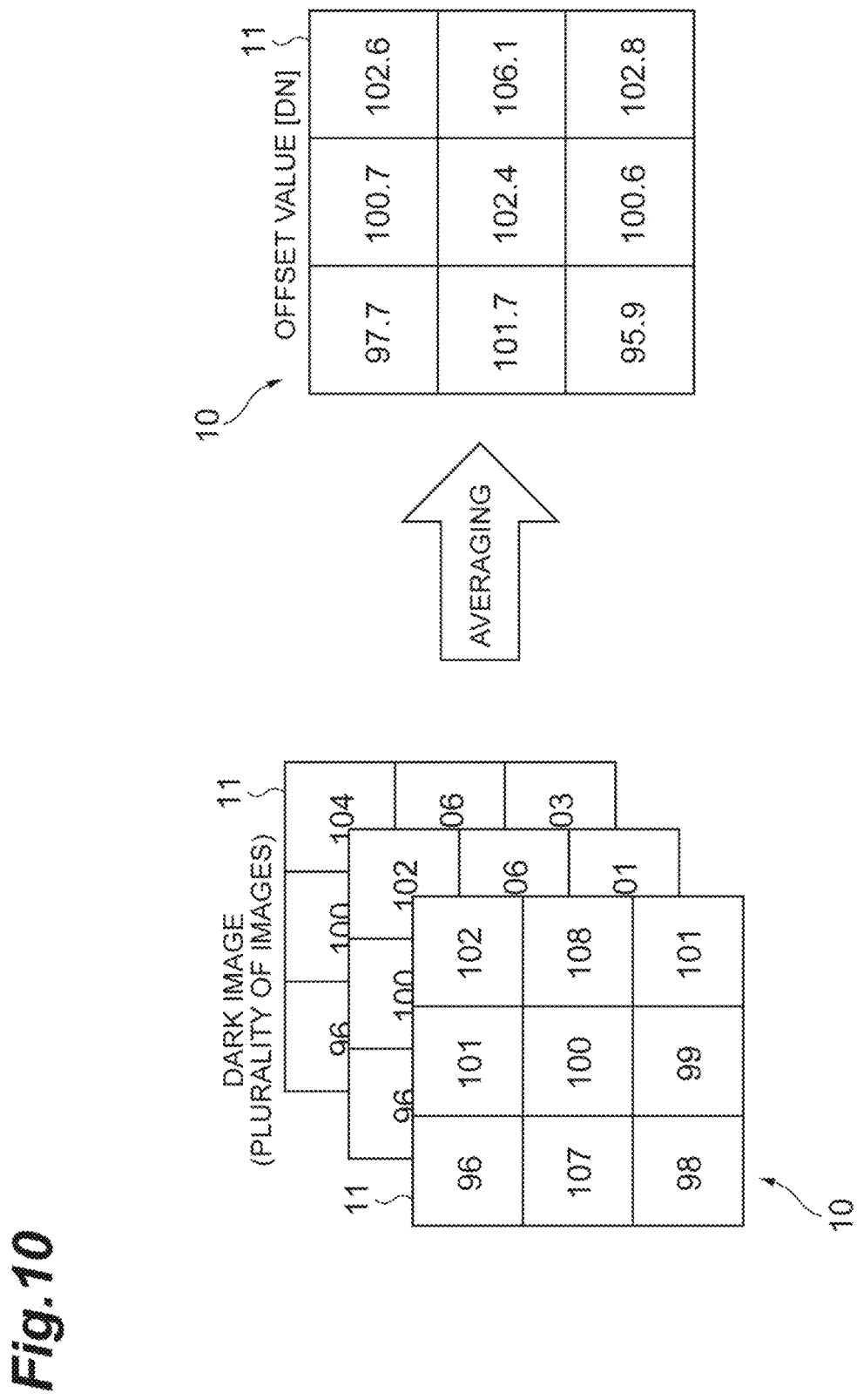
FIG. 10 is a diagram schematically illustrating a process of deriving an offset value.

Digital value after correction=((digital value−offset value)/gain)×apparent gain+apparent offset value The offset value and the gain in the above correction equation are included in the reference data stored in the storage unit 21. Here, a process of acquiring the gain and the offset value will be described. FIG. 10 is a schematic diagram illustrating a process of acquiring an offset value. The digital value is expressed by the following equation as described above. Therefore, the offset value is indicated as a digital value that is output from the CMOS image sensor 10 in a state in which no light is input. Therefore, when the offset value is acquired, a digital value output for each of a plurality of pixels is first obtained on the basis of a plurality of dark images acquired by the CMOS image sensor 10 in a state in which no light is input. The offset value is acquired by averaging the acquired digital values for each pixel.

Digital value [DN]=gain [DN/e]×number of electrons [e]+offset value [DN]

Figure 11:
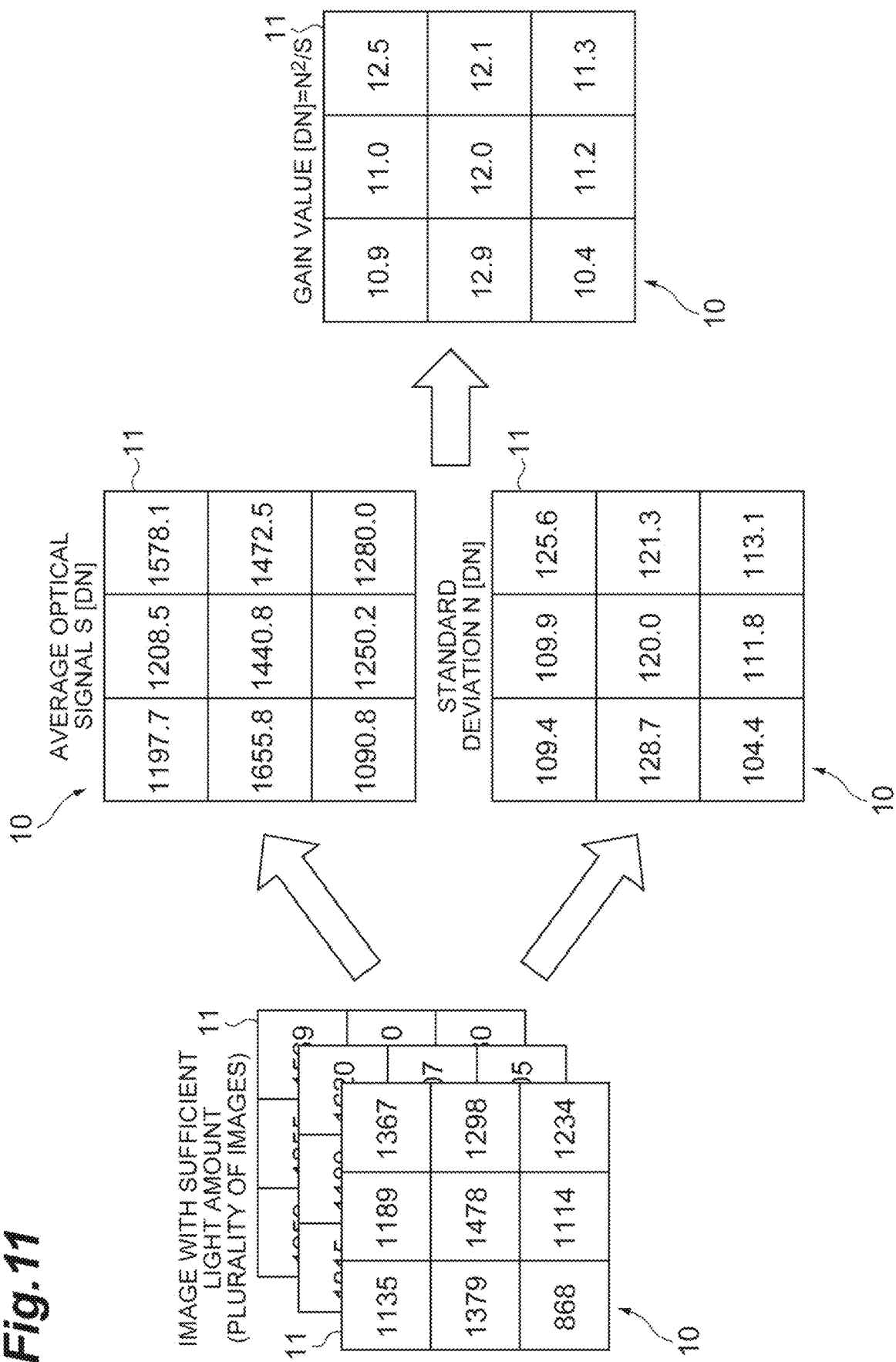
FIG. 11 is a diagram schematically illustrating a process of deriving a gain.

FIG. 11 is a schematic diagram illustrating a process of acquiring a gain. When a gain of each pixel is acquired, a plurality of frame images are acquired by the CMOS image sensor 10 under a condition in which a sufficient amount of light is given. An average optical signal value S [DN] of the digital value in each pixel and a standard deviation N [DN] are acquired. Since the gain is expressed by $N^2/S$, the gain is derived from the average optical signal value S and the standard deviation N.

Figure 12:
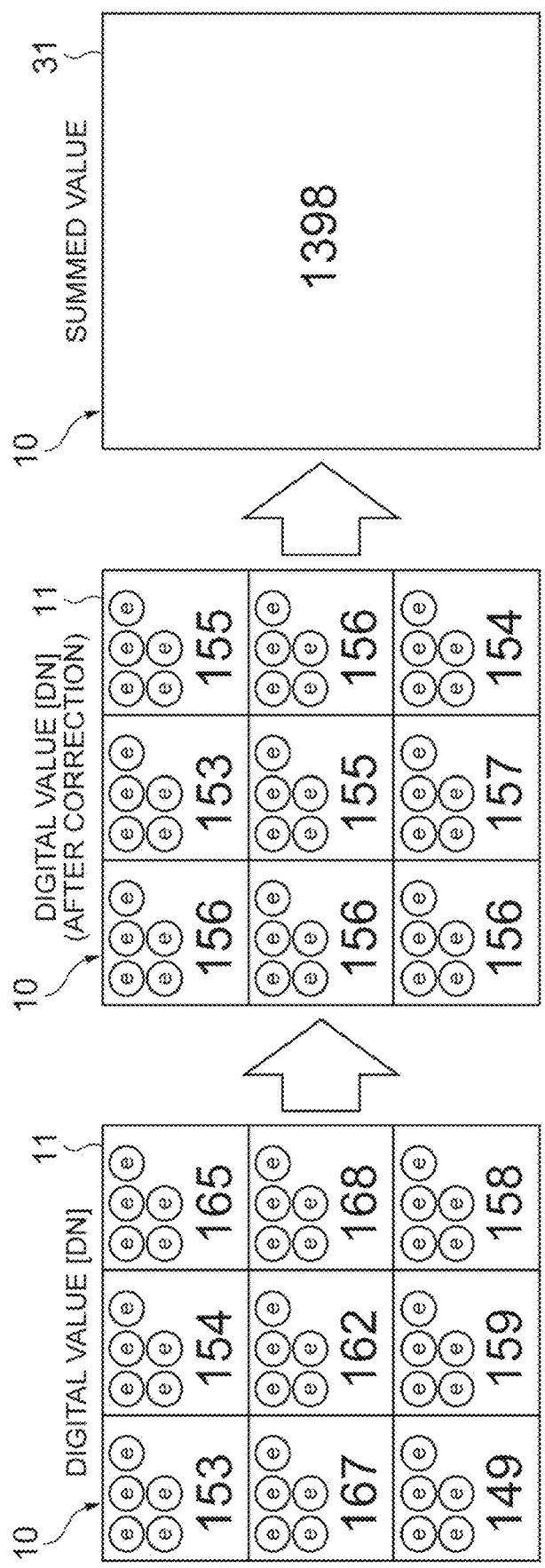
FIG. 12 is a diagram illustrating a correspondence between a measured digital value and a digital value after correction.

FIG. 12 is a diagram illustrating a correspondence between the measured digital value and a digital value after correction. In the example of FIG. 12, each pixel 11 configuring the CMOS image sensor 10 has the gain illustrated in FIG. 10 and the offset value illustrated in FIG. 11. In The example of FIG. 12, an example in which the digital value measured by the CMOS image sensor 10 in FIG. 9 has been corrected by the above correction equation is illustrated. In this example, the conversion unit 24 corrects the digital value so that the apparent gain in all the pixels is 11 [DN/e] and the apparent offset value is 100 [DN]. That is, the digital value after the correction is derived using the following correction equation.

Digital value after correction=((digital value−offset value)/gain)×11+100

The conversion unit 24 acquires the number of electrons using threshold value data common to the respective pixels with respect to the digital value after the correction. For example, the storage unit 21 may hold a threshold value range derived by the following equation as a table. The conversion unit 24 can convert the digital value after the correction to the number of electrons by referring to the threshold value data held in the table. In the example of FIG. 12, the apparent gain is 11 [DN/e], and the apparent offset value is 100 [DN]. Therefore, in the binning of 3×3 pixels, when the binning size is "9" and the digital value after correction is 1390 to 1400, it is determined that the number of electrons is 45. The conversion unit 24 can obtain the number of photons by dividing the converted number of electrons by the quantum efficiency.

Figure 13:
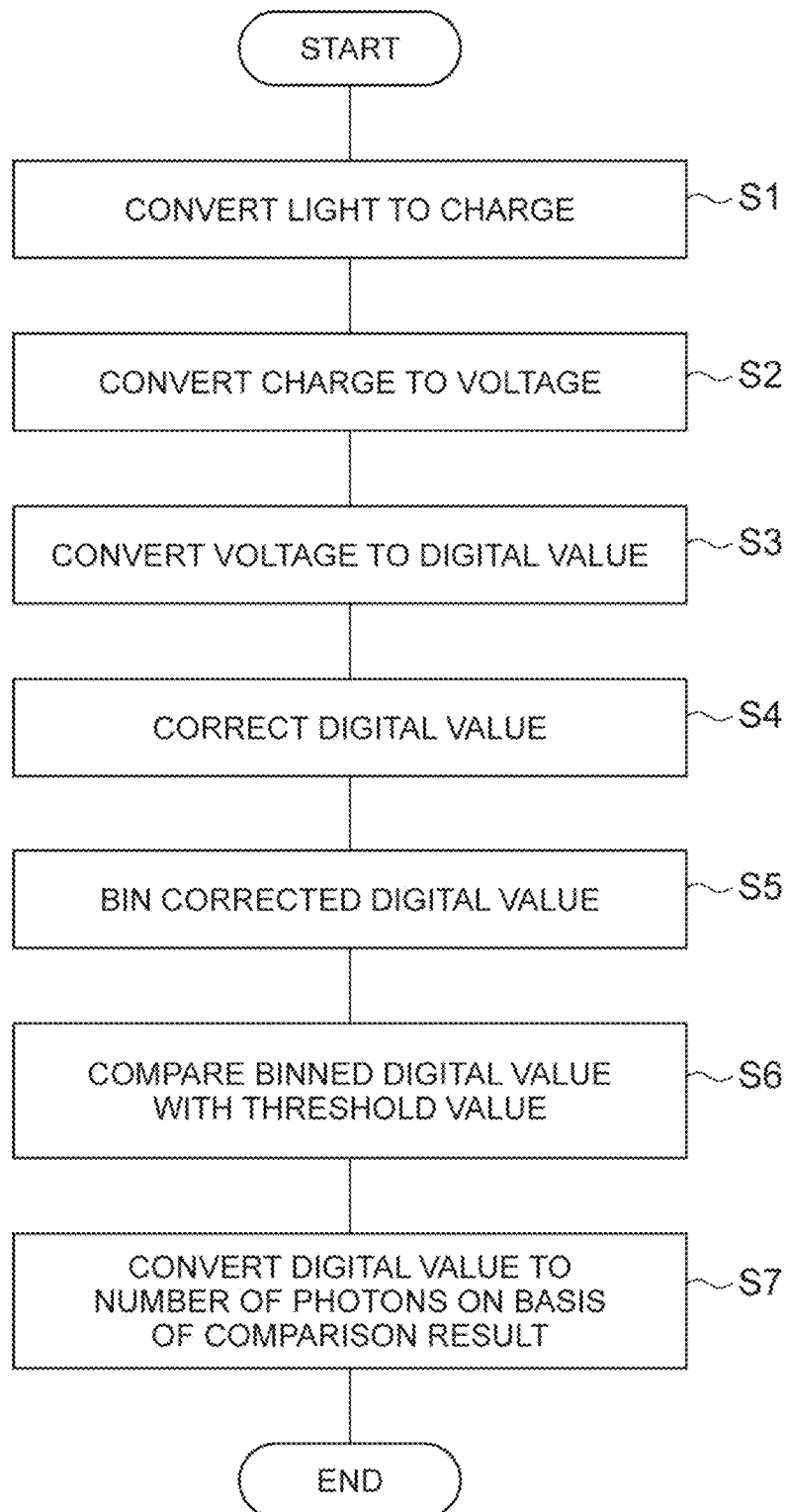
FIG. 13 is a flowchart illustrating an operation of the photon counting device.

Threshold value(lower limit)=(number of electrons−0.5)×apparent gain+apparent offset value×binning size Threshold value(upper limit)=(number of electrons+0.5)×apparent gain+apparent offset value×binning size Next, an operation of the photon counting device 1 will be described. FIG. 13 is a flowchart illustrating an operation of the photon counting device. In the embodiment, when the measurement is started in a state in which the photon counting device 1 is operated, light incident on the pixels of the CMOS image sensor 10 is first converted to charge by the photodiode 12 (step S1). The converted charge is converted to a voltage by the amplifier 13 (step S2). The voltage is converted to a digital value by the A/D converter 15 and output to the computer 20 (step S3). The digital value is corrected for each pixel by the correction unit 22 of the computer 20 (step S4). The corrected digital value is binned (step S5). That is, the corrected digital values corresponding to the pixels 11 constituting the binned pixel 31 are summed and a summed value is output. The summed value, that is, the binned digital value is compared with the threshold value data (step S6), and is converted to the number of photons on the basis of a comparison result (step S7). Thereby, the number of input photons is measured for each binned pixel. A measurement result, for example, may be displayed on the display device 27 as image data or the like, or may be output as a numerical value.

As described above, in the photon counting device 1, a voltage according to the input photons is output from the amplifier 13. The voltage is converted to a digital value by the A/D converter 15. When the binning of the pixel 11 is performed, a summed value obtained by summing the digital values corrected by the correction unit 22 is converted to the number of photons. The correction unit 22 corrects the digital value so that an influence of the variation in the gain and the offset value among the plurality of pixels 11 is curbed. That is, when the same number of photons are input, the variation for each pixel 11 is curbed in the corrected digital value. Thereby, it is difficult for an influence of the variation in the gain and offset value among the pixels to be reflected in the summed value, and it is easy for only the number of photons to be reflected in the summed value. Therefore, a degradation of photon counting accuracy can be curbed.

The correction unit 22 may have a parameter corresponding to the gain and the offset value, which is a preset parameter common to a plurality of pixels, and correct the digital value for each of the plurality of pixels on the basis of a deviation between the gain and offset value and the parameter. In this configuration, since the digital value is corrected according to the deviation between the parameter serving as a reference, and the gain and offset value, for example, the summed value can be converted to the number of photons using a threshold value based on the parameter.

The readout noise of the amplifier 13 may be equal to or less than 0.2 [e-rms]. In this case, for example, the incorrect detection rate can be curbed to 1% or less. Further, the readout noise of the amplifier 13 may be equal to or less than 0.15 [e-rms]. In this case, for example, the incorrect detection rate can be curbed to 0.1% or less.

The gain may be equal to or more than 10 [DN/e]. Since the CMOS image sensor 10 has a high gain, it is possible to accurately reproduce an analog value output from the amplifier 13 as a digital value.

Although the embodiments have been described in detail with reference to the drawings, a specific configuration is not limited to the embodiments.

For example, in the CMOS image sensor 10 of the embodiment, an example in which the readout noise of each pixel is equal to or less than 0.4 [e-rms] has been described. However, even when the readout noise is equal to or less than 0.4 [e-rms] in a sensor specification, noise of some pixels may be greater than 0.4 [e-rms]. In such a case, pixels of which the readout noise is equal to or less than 0.4 [e-rms] may be ascertained in advance by measurement or the like, and photon counting may be executed using only the pixels of which the readout noise is equal to or less than 0.4 [e-rms].

Further, an example in which the digital value after correction is obtained by the following equation has been illustrated, but the present invention is not limited thereto.

Digital value after correction=((digital value−offset value)/gain)×apparent gain+apparent offset value For example, the digital value after the correction may be obtained by the following equation.

Digital value after correction=((digital value−offset value)/gain)×apparent gain In this case, for example, the storage unit 21 may hold a threshold value range derived by the following equation as a table. The conversion unit 24 can convert the digital value after correction to the number of electrons by referring to the threshold value data held in the table.

Threshold value(lower limit)=(number of electrons−0.5)×apparent gain

Threshold value(upper limit)=(number of electrons+0.5)×apparent gain

Further, the digital value after the correction may be obtained by the following equation.

Digital value after correction=((digital value−offset value)/gain)

In this case, for example, the storage unit 21 may hold a threshold value range derived by the following equation as a table. The conversion unit 24 can convert the digital value after the correction to the number of electrons by referring to the threshold value data held in the table.

Threshold value(lower limit)=(number of electrons−0.5)

Threshold value(upper limit)=(number of electrons+0.5)

REFERENCE SIGNS LIST

1: photon counting device
11: Pixel
12: Photodiode (photoelectric conversion element)
13: Amplifier
15: A/D converter
21: Storage unit
22: Correction unit
23: Calculation unit
24: Conversion unit

The invention claimed is:

1. A device for photon counting, the device comprising:
a plurality of pixels each including a photoelectric conversion element configured to convert input light to charge, and an amplifier configured to amplify the charge converted by the photoelectric conversion element and convert the charge to a voltage;
an A/D converter configured to convert the voltage output from the amplifier of each of the plurality of pixels to a digital value and output the digital value; and
a computer configured to correct the digital value output from the A/D converter so that an influence of a variation in a gain and an offset value among the plurality of pixels is curbed,
output a summed value obtained by summing the corrected digital values in at least two pixels, wherein the computer is configured to correct the digital value for each of the plurality of pixels based on a deviation between the gain and offset value and a parameter by referring to the parameter corresponding to the gain and the offset value, the parameter being a preset parameter common to the plurality of pixels, and
convert the summed value to a number of photons.

2. The device according to claim 1, wherein a readout noise of the amplifier is equal to or less than 0.2 [e-rms].

3. The device according to claim 1, wherein a readout noise of the amplifier is equal to or less than 0.15 [e-rms].

4. The device according to claim 1, wherein the gain is equal to or more than 10 [DN/e].

5. A method for photon counting, the method comprising:
converting light input to respective photoelectric conversion elements constituting a plurality of pixels to charge;
amplifying, by an amplifier constituting the plurality of pixels, the converted charge and converting the charge to a voltage;
converting, by an A/D converter, the voltage output from the amplifier to digital value and outputting the digital value;
correcting the digital value output from the A/D converter so that an influence of a variation in a gain and an offset value among the plurality of pixels is curbed, wherein the correcting the digital value includes correcting the digital value for each of the plurality of pixels based on a deviation between the gain and offset value and a parameter, and the parameter corresponds to the gain and the offset value and is set in advance to be common to the plurality of pixels; and
summing the corrected digital values corresponding to at least two pixels and outputting a summed value; and
converting the summed value to a number of photons.

6. The method according to claim 5, wherein readout noise of the amplifier is equal to or less than 0.2 [e-rms].

7. The method according to claim 5, wherein readout noise of the amplifier is equal to or less than 0.15 [e-rms].

8. The method according to claim 5, wherein the gain is equal to or more than 10 [DN/e].

* * * * *